(12) United States Patent
Langsdorf

(10) Patent No.: US 8,991,195 B2
(45) Date of Patent: Mar. 31, 2015

(54) METHOD FOR TESTING A PELTIER ELEMENT AS WELL AS A SMALL ELECTRICAL APPLIANCE WITH A PELTIER ELEMENT AND A SAFETY DEVICE

(75) Inventor: Jan Christian Langsdorf, Oberursel (DE)

(73) Assignee: Braun GmbH, Kronberg (DE)

(*) Notice: Subject to any disclaimer, the term of this patent is extended or adjusted under 35 U.S.C. 154(b) by 265 days.

(21) Appl. No.: 13/351,262

(22) Filed: Jan. 17, 2012

(65) Prior Publication Data

US 2012/0234022 A1  Sep. 20, 2012

(30) Foreign Application Priority Data

Mar. 17, 2011  (EP) .................................... 11002197

(51) Int. Cl.
*F25B 21/02*     (2006.01)
*H01L 35/00*     (2006.01)

(52) U.S. Cl.
CPC ..................................... *H01L 35/00* (2013.01)
USPC ............................................ 62/3.7; 62/259.3

(58) Field of Classification Search
CPC ........... H01L 35/00; F25B 21/02; H01I 35/30
USPC ............ 62/3.7, 3.2, 259.3; 324/451; 361/162, 361/679.54
See application file for complete search history.

(56) References Cited

U.S. PATENT DOCUMENTS

| 5,568,977 | A  | * | 10/1996 | Gschwind et al. ............... 374/45 |
| 8,271,230 | B2 | * | 9/2012 | Federer et al. ................ 702/181 |
| 2002/0073716 | A1 | * | 6/2002 | Melaragni ........................ 62/3.7 |
| 2005/0139248 | A1 |  | 6/2005 | Strnad |
| 2008/0174909 | A1 | * | 7/2008 | Ohkawara .................. 360/97.02 |
| 2009/0049694 | A1 |  | 2/2009 | Morris |
| 2010/0153066 | A1 | * | 6/2010 | Federer et al. ................ 702/181 |
| 2010/0288323 | A1 | * | 11/2010 | Schroeder et al. ............ 136/201 |
| 2010/0290184 | A1 |  | 11/2010 | Tani |

FOREIGN PATENT DOCUMENTS

| JP | 61-240988 | 10/1986 |
| JP | 2007/014084 A | 1/2007 |
| JP | 2007/087343 A | 4/2007 |
| JP | 2010-267153 | 11/2010 |
| KR | 2005/0013300 A | 2/2005 |

OTHER PUBLICATIONS

European Search Report dated Aug. 23, 2011, 6 pages.

* cited by examiner

*Primary Examiner* — Mohammad M Ali
(74) *Attorney, Agent, or Firm* — Jay A. Krebs; Jeffrey V. Bamber

(57) ABSTRACT

A method with the following steps is described for testing a Peltier element: applying a voltage to the Peltier element; switching off the voltage at the end of a defined period of time; measuring the voltage at the Peltier element; and comparing the measured voltage with a reference value. Furthermore, a small electrical appliance, such as an electric shaver, with a Peltier element is described, which small electrical appliance has a safety device which ensures that a malfunction of the Peltier element cannot result in danger to the user.

9 Claims, 2 Drawing Sheets

METHOD FOR TESTING A PELTIER ELEMENT AS WELL AS A SMALL ELECTRICAL APPLIANCE WITH A PELTIER ELEMENT AND A SAFETY DEVICE

FIELD OF THE INVENTION

The invention relates to a method for testing a Peltier element as well as to a small electrical appliance, such as an electric shaver, with a Peltier element and a safety device.

BACKGROUND OF THE INVENTION

WO 2010/003603 A1 discloses a shaver which has a Peltier element for cooling the skin of a user while shaving. With Peltier elements, the danger exists that the element may be destroyed by mechanical or thermal effects. For example, the element may break if it falls down or the electrical connections may be damaged by overheating. As a result, the internal resistance and the cooling performance of the element change. This can lead to the situation that the element may no longer cool and heats up instead, such that also the side of the element which is actually to be cooled becomes so hot that the user can be burned on it.

It is the object of the present patent application to specify a simple and reliable method for testing a Peltier element as well as a small electrical appliance with a Peltier element, given that the user is protected against any malfunctioning of the Peltier element.

SUMMARY OF THE INVENTION

This object is accomplished via a method in which the following steps are carried out in order to check a Peltier element: to begin with, a voltage is applied to the Peltier element for a certain period of time. At the end of this period of time, the voltage at the Peltier element is switched off, and after this the voltage at the Peltier element is measured and compared with a reference value.

This method makes use of the nature of a Peltier element to function as both a heating or cooling element and a thermoelectric generator. By applying the voltage, a current is caused to flow through the Peltier element for a certain period of time, which ensures that—if the Peltier element is intact—a temperature difference arises between the cold side of the Peltier element and the warm side of the Peltier element. Therefore, after the voltage is switched off a thermoelectric voltage which corresponds to this temperature difference will be measurable at the Peltier element. However, if the Peltier element is not intact no temperature difference or only a smaller temperature difference occurs and therefore no (or only a comparatively small) thermoelectric voltage can be measured either. The measured thermoelectric voltage is therefore compared with at least one reference value and, if necessary, a function is triggered—for example a display device is activated or a control signal is generated—if the comparison reveals that the Peltier element is defective, that is, if the measured thermoelectric voltage is outside of the permissible range defined by the reference value.

This method is intended for testing a Peltier element which is installed in a small electric device, for example an electric shaver. The small electrical appliance has a safety device which ensures that a malfunction of the Peltier element cannot become dangerous for the user. The safety device is suitable for carrying out the steps of the method described above and contains a safety circuit (for example a microcontroller) and a switch which can be controlled by the safety circuit. The safety circuit is connected with a device for measuring the thermoelectric voltage of the Peltier element and has a device for comparing the measured voltage with at least one reference value. The controllable switch is connected in series with the Peltier element and a power supply device. The safety device furthermore may have at least one display device which is activated by the safety circuit when the Peltier element is defective. In the case of a motor-driven small electrical appliance which has a control circuit for the motor, the safety circuit may be connected with the control circuit in order to prevent the motor of the small electrical appliance being switched on if the Peltier element is defective. In this way, the user can be prevented from using the defective small electrical appliance. The safety circuit and the control circuit may be implemented in a single microcontroller.

The safety device is advantageously always activated when the small electrical appliance is switched on by a user and then carries out a test of the Peltier element which advantageously takes only fractions of a second. If the safety device is connected with the control circuit of the small electrical appliance and the safety device establishes that the Peltier element is in order, it outputs a corresponding signal to the control circuit, which thereupon switches on the small electrical appliance with a delay which practically cannot be perceived by the user. Of course, the testing of the Peltier element can be repeated at certain time intervals.

Advantageously, the safety device may also have a temperature sensor which measures the temperature of the warm side of the Peltier element or the temperature in the surroundings of the warm side of the Peltier element and which is connected with the safety circuit. By measuring the thermoelectric voltage at the Peltier element, the safety circuit can determine the temperature of the cold side of the Peltier element while taking the temperature measured by the temperature sensor into consideration. In the case of an electric shaver whose Peltier element should cool the skin of a user while shaving, the cold side is the side of the Peltier element which can come into contact with the skin of the user. If the temperature of the cold side is not within a certain temperature range which is defined by a first and a second limiting value, the safety circuit may also activate a warning device and/or prevent the driving mechanism of the shaver from being switched on.

BRIEF DESCRIPTION OF THE DRAWINGS

The invention is explained by means of an exemplary embodiment of a small electrical appliance, the safety device of which operates according to the method according to the invention.

DETAILED DESCRIPTION OF THE INVENTION

Figure 1:
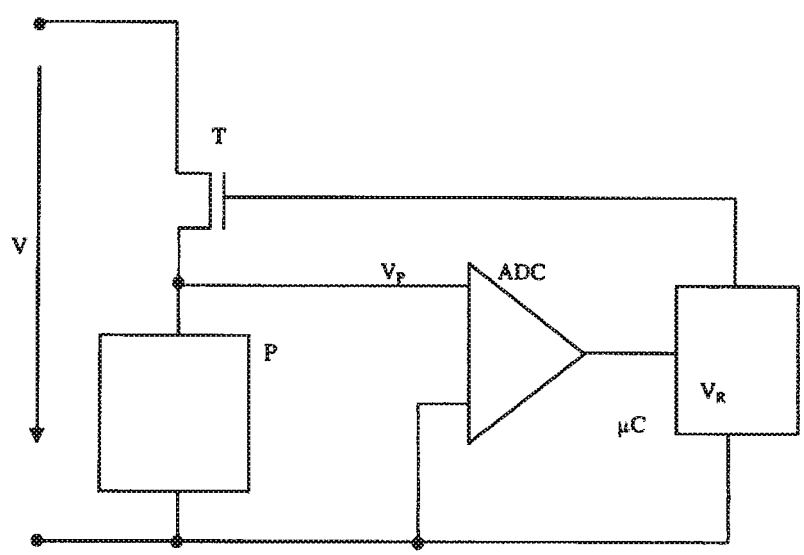
FIG. 1 shows a circuit arrangement with a safety circuit.

The circuit arrangement shown in FIG. 1 has a safety circuit, for example a microcontroller µC which is connected with a controllable switch T, for example a transistor. The controllable switch T is connected in series with a Peltier element P. A device for measuring the voltage $V_P$ at the Peltier element P has an analog/digital converter ADC, the inputs of which are connected in parallel with the Peltier element P and the output of which is connected to the microcontroller µC.

The microcontroller µC is designed for testing the Peltier element P. For this purpose it contains a known device for triggering the controllable switch T, a device for generating a reference voltage $Y_R$ and a device for comparing the voltage $V_P$ supplied by the analog/digital converter ADC with the reference voltage $Y_R$. Furthermore, a workflow controller which controls the steps of the method shown schematically in FIG. 2 is implemented in the microcontroller μC.

This circuit arrangement is intended for a small electrical appliance, advantageously for an electric shaver, with a Peltier element, what is known as the warm side of which is connected thermally with a cooling body and what is known as the cold side of which is disposed in the shaver so that it can cool the skin of a user while shaving. Otherwise, the shaver contains a known control circuit with which the functions of the shaver—for example its motor—can be controlled. The control circuit may be implemented in the microcontroller μC or separately therefrom.

For a different embodiment (which is not shown in the Figures) the safety device also includes yet another temperature sensor which is in thermal contact with the warm side of the Peltier element P and is connected electrically with the safety circuit. The safety circuit, for example a microcontroller, contains a device for determining the temperature of the cold side of the Peltier element, which determines the temperature of the cold side of the Peltier element from the temperature of the warm side of the Peltier element (supplied by the temperature sensor) and the voltage at the Peltier element (supplied by the analog/digital converter ADC). The workflow controller is designed so that the cold side of the Peltier element P is brought to a temperature which lies within a temperature range stored in the microcontroller and is perceived by a user as pleasant, for example in a range between 10° C. and 20° C. For this purpose the controllable switch T is correspondingly triggered by the safety circuit. In a further embodiment the workflow controller is designed so that the cold side of the Peltier element cannot assume an excessively high temperature, meaning that if necessary said workflow controller interrupts the supply of current to the Peltier element P in good time by means of the controllable switch T.

Figure 2:
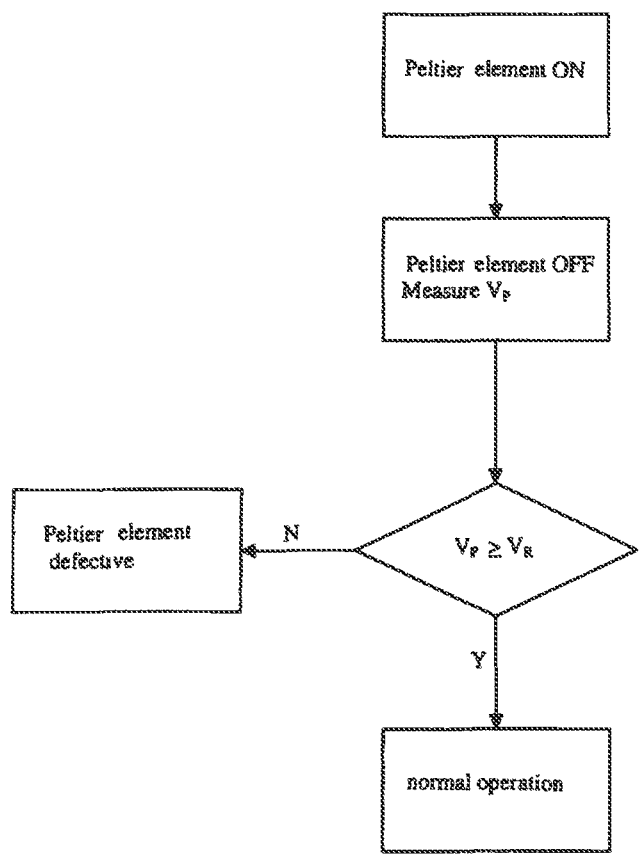
FIG. 2 shows a workflow diagram.

The steps of the method for testing the Peltier element are shown in FIG. 2. To begin with, the Peltier element P is switched on over the controllable switch T so that, if the Peltier element is intact, a temperature difference develops between its warm and cold sides. After a brief period of time, for example about 2 ms, the Peltier element is switched off and immediately afterwards the voltage $V_P$ at the Peltier element is measured and compared by the microcontroller μC with the reference voltage $V_R$. If the voltage $V_P$ is higher than the reference voltage $V_R$ the Peltier element is in order, and if the voltage $V_P$ is lower than the reference voltage $V_R$ the Peltier element is defective. In an additional step (which is not shown in FIG. 2) it is possible to differentiate between a defective Peltier element and a reversal of polarity.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method for testing a Peltier element disposed in an electrical appliance, the method comprising the following steps:
   providing a Peltier element, said Peltier element comprising a warm side and a cold side, the cold side of which is positioned to come into contact with the skin of a user when the Peltier element is in use;
   applying a voltage (V) to the Peltier element;
   switching off the voltage (V) at the end of a defined period of time;
   measuring the voltage (Vp) at the Peltier element;
   comparing the measured voltage (Vp) with a reference value (Vr) and an electric shaver generating a control signal that prevents the electrical appliance from being switched on if comparison of the measured voltage (Vp) with the reference value (Vr) reveals that the Peltier element is defective.

2. The method of claim 1 wherein the magnitude of the voltage ($V_P$) at the Peltier element is compared with the reference value ($V_R$).

3. The method of claim 1 further comprising providing a display device associated with the Peltier element, wherein the display device is activated when the comparison reveals that the measured voltage ($V_P$) lies outside of the permissible range defined by the reference value.

4. An electrical appliance with a Peltier element, said Peltier element comprising a warm side and a cold side, the cold side of which is positioned to come into contact with the skin of a user during use, said electrical appliance further comprising a safety device for testing said Peltier element by:
   applying a voltage (V) to the Peltier element;
   switching off the voltage (V) at the end of a defined period of time;
   measuring the voltage (Vp) at the Peltier element; an~
   comparing the measured voltage (Vp) with a reference value (Vr) and an electric shaver generating a control signal that prevents the electrical appliance from being switched on if comparison of the measured voltage (Vr) with the reference value reveals that the Peltier element is defective.

5. The electrical appliance of claim 4 wherein the safety device comprises: a safety circuit; a device for measuring the voltage ($V_P$) at the Peltier element (P) which is connected with the safety circuit; and a controllable switch (T) which is connected in series with the Peltier element (P) and can be controlled by the safety circuit.

6. The electrical appliance of claim 5 further comprising a display device associated with the Peltier element which can be controlled by the safety circuit.

7. The electrical appliance of claim 4, wherein the safety device comprises a temperature sensor.

8. The electrical appliance of claim 7 wherein the safety device switches off the electrical appliance when the temperature of the cold side of the Peltier element is higher than a first limiting value or lower than a second limiting value.

9. The electrical appliance of claim 7 further comprising a warning device associated with the safety device wherein the warning device is activated when the temperature of the cold side of the Peltier element is higher than a first limiting value or lower than a second limiting value.

\* \* \* \* \*